US010025707B2

(12) United States Patent
Sudo

(10) Patent No.: US 10,025,707 B2
(45) Date of Patent: Jul. 17, 2018

(54) NON-VOLATILE SEMICONDUCTOR MEMORY DEVICE

(71) Applicant: Winbond Electronics Corp., Taichung (TW)

(72) Inventor: Naoaki Sudo, Kanagawa (JP)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 15/703,997

(22) Filed: Sep. 14, 2017

(65) Prior Publication Data

US 2018/0074952 A1   Mar. 15, 2018

(30) Foreign Application Priority Data

Sep. 15, 2016   (JP) .................................. 2016-180083

(51) Int. Cl.
*G11C 7/10* (2006.01)
*G06F 12/02* (2006.01)
*G06F 3/06* (2006.01)
*G06F 11/10* (2006.01)
*G06F 12/126* (2016.01)
*G11C 16/34* (2006.01)
*G11C 29/42* (2006.01)
*G11C 29/44* (2006.01)
(Continued)

(52) U.S. Cl.
CPC .......... *G06F 12/0246* (2013.01); *G06F 3/064* (2013.01); *G06F 3/0608* (2013.01); *G06F 11/1048* (2013.01); *G06F 12/126* (2013.01); *G11C 16/3409* (2013.01); *G11C 29/42* (2013.01); *G11C 29/4401* (2013.01); *G11C 16/0483* (2013.01); *G11C 2029/0411* (2013.01)

(58) Field of Classification Search
CPC ..... G11C 16/26; G11C 16/3445; G11C 29/00; G11C 29/42
See application file for complete search history.

(56) References Cited

U.S. PATENT DOCUMENTS 8,375,146 B2 *  2/2013  Sinclair .................. G06F 13/42
                                          709/220
9,053,012 B1 *  6/2015  Northcott ............... G11C 29/42
(Continued)

FOREIGN PATENT DOCUMENTS

JP  2013235642   11/2013
TW  201403605   1/2014

OTHER PUBLICATIONS

"Office Action of Taiwan Counterpart Application," dated Feb. 23, 2018, p. 1-p. 5.

*Primary Examiner* — Tuan T Nguyen
(74) *Attorney, Agent, or Firm* — JCIPRNET

(57) ABSTRACT

A flash memory includes a memory array including a memory mat MAT-0, MAT-1; a page buffer 170-0, holding data read from the memory mat MAT-0; a page buffer 170-1, holding data read from the memory mat MAT-1; an ECC circuit 140, performing data error checking and correction; an output buffer 110 for outputting data; and a transferring control element, controlling transferring of data between the page buffer 170-0, page buffer 170-1, ECC circuit 140 and output buffer 110. When the memory mat MAT-0 is selected, the transferring control element transfers data held by the page buffer 170-0 to the page buffer 170-1 of the memory mat MAT-1.

12 Claims, 8 Drawing Sheets

(51) Int. Cl.
    *G11C 16/04*         (2006.01)
    *G11C 29/04*         (2006.01)

(56) References Cited

U.S. PATENT DOCUMENTS

| | | |
|---|---|---|
| 9,881,684 B2 * | 1/2018 | Shirakawa ......... G11C 16/3445 |
| 2006/0227607 A1 | 10/2006 | Park et al. |
| 2009/0083485 A1 * | 3/2009 | Cheng .................... G11C 29/74 |
| | | 711/114 |
| 2013/0279232 A1 * | 10/2013 | Sharette .................. H01L 23/36 |
| | | 365/51 |
| 2013/0336060 A1 | 12/2013 | Arakawa |
| 2015/0121174 A1 | 4/2015 | Nakagawa |
| 2015/0262698 A1 * | 9/2015 | Shirakawa ......... G11C 16/3445 |
| | | 365/185.11 |
| 2017/0365335 A1 * | 12/2017 | Wang ................. G11C 16/0483 |

* cited by examiner

NON-VOLATILE SEMICONDUCTOR MEMORY DEVICE

CROSS-REFERENCE TO RELATED APPLICATION

This application claims the priority benefit of Japan application serial no. 2016-180083, filed on Sep. 15, 2016. The entirety of the above-mentioned patent application is hereby incorporated by reference herein and made a part of this specification.

TECHNICAL FIELD

The invention is related to a non-volatile semiconductor memory device, and particularly related to a reading method of an NAND flash memory having an on-chip error checking correction function.

DESCRIPTION OF RELATED ART

For existing memory chips, physical defects of a memory device generated during a manufacturing process is fixed on appearance by using a redundancy scheme. Moreover, apart from utilizing the redundancy memory for physical repair, there is also error checking correction (ECC) circuit as a solution for soft errors.

In an NAND flash memory described in patent document 1, a high speed buffer register is composed of two parts. When data is output from one of the high speed buffer register, a data error correction code operation is performed in the other high speed buffer register. In this manner, the delay of error correction code operation is eliminated from output such that high speed reading can be achieved.

PRIOR-ART DOCUMENTS

Patent Documents

[Patent Document 1] Japan Patent Publication No. 2013-235642

Problems to be Solved by the Invention

FIG. 1 illustrates a schematic configuration of a conventional NAND flash memory having an on-chip ECC function. FIG. 2 illustrates a timing chart when the continuous reading for pages is performed. First of all, a page 0 is read; the data of the page 0 is held in a first high speed buffer portion C0 and a second high speed buffer portion C1 (P0C01, P0C1) of a latch L1 of a page buffer 20. Next, the data in the first high speed buffer portion C0 of the latch L1 is transferred to the first high speed buffer portion C0 of a latch L2, and the data in the first high speed buffer portion C0 is transferred to an ECC circuit 40 in parallel. In the ECC circuit 40, an ECC decoding operation is performed; when an error is detected, the data in the first high speed buffer portion C0 of the latch L2 is corrected.

Thereafter, the data in the second high speed buffer portion C1 of the latch L1 is transferred to the latch L2, and the data transferred to the second high speed buffer portion C1 of the latch L2 is transferred to the ECC circuit 40, and ECC decoding operation is performed therein. When an error is detected, the data in the second high speed buffer portion C1 is corrected.

Subsequently, the data in the first high speed buffer portion C0 of the latch L1 is transferred to the latch L2, and the data transferred to the first high speed buffer portion C0 of the latch L2 is transferred to the ECC circuit 40, and the ECC decoding operation is performed therein. When an error is detected, the data of the first high speed buffer portion C0 is corrected. In this manner, by using two-stage latches L1 and L2, the ECC operation is performed on the second high speed buffer portion C1 while the data in the first high speed buffer portion C0 is outputted, and the ECC operation is performed on the first high speed buffer portion C0 while the data in the second high speed buffer portion C1 is outputted, thereby realizing high speed of continuous reading for pages.

However, in the condition of performing high speed reading as mentioned above, it is required to configure two-stage latches L1 and L2 in the page buffer 20; as a result, the area of the page buffer 20 is increased, and it is difficult to achieve miniaturization of the flash memory.

SUMMARY OF INVENTION

The objective of the invention is to solve the conventional problem mentioned above by providing a non-volatile semiconductor memory device that achieves miniaturization, high speed with an on-chip ECC function.

Technical Means for Solving the Problem

A non-volatile semiconductor memory device of the invention includes a memory array which at least includes a first memory plane and a second memory plane; a reading element which is capable of reading data from the first memory plane or the second memory plane; a first data holding element which is capable of holding data read from the first memory plane; a second data holding element which is capable of holding data read from the second memory plane; an error checking correcting element which performs data error checking and correction; an outputting element which outputs data; and a transferring control element which controls transferring of data between the first data holding element, the second data holding element, the error checking correcting element and the outputting element. When the first memory plane is selected, the transferring control element transfers the data held by the first data holding element to the second data holding element of the non-selected second memory plane.

Effect of the Invention

According to the invention, when the first memory plane is selected, the data held by the first data holding element is transferred to the second data holding element of the non-selected second memory plane so that the second data holding element of the non-selected second memory plane and the first data holding element can be used at the same time; as a result, high-speed reading can be realized via the two-stage data holding elements.

DESCRIPTION OF EMBODIMENTS

Hereinafter, embodiments of the invention are described in detail with reference to the figures. It should be noted that, in order to clearly illustrate the components to facilitate comprehension, the components in the figures may not be drawn to scale.

Figure 3:
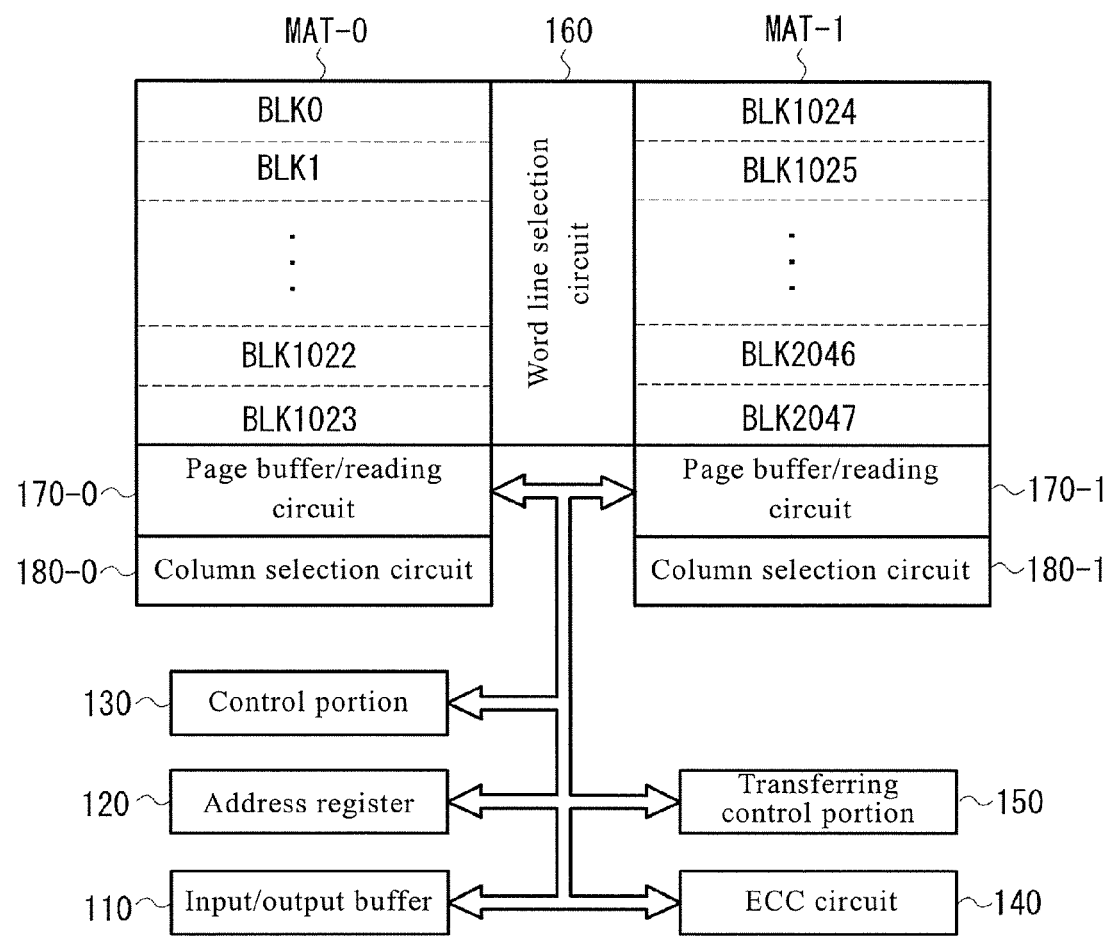
FIG. 3 illustrates a configuration of an NAND flash memory according to an embodiment of the invention.

FIG. 3 is a block diagram illustrating an example of configuration of an NAND flash memory according to an embodiment of the invention. As shown in FIG. 3, a flash memory 100 includes a memory cell array including two memory mats MAT-0, MAT-1 formed with a plurality of memory cells arranged in matrix; an input/output buffer 110 connected to an external input/output terminal I/O; an address register 120 receiving address data from the input/output buffer 110; a control portion 130 which controls reading, programming and erasing operations according to a command or an external control signal (e.g., chip enable CE, command latch enable CLE, address latch enable ALE, ready/busy RY/BY that are not shown) from the input/output buffer 110; an ECC circuit 140 which performs error checking and correcting operation on the data to be programmed to the memory mat MAT-0, MAT-1 or the data read therefrom; a transferring control portion 150 which controls transferring of data based on the control performed by the control portion 130; a word line selection circuit 160 which decodes a row address information Ax from the address register 120, and performs selection of blocks of the memory mat MAT-0 or MAT-1, selection of word lines and so on according to the decoding result; a page buffer/reading circuit 170 which holds the data read from a bit line, or holds the data programmed via the bit line; and a column selection circuit 180 which decodes a column address information Ay from the address register 120, and performs selection of the bit lines and so on according to the decoding result. And, although no drawings are provided in this regard, the flash memory 100 may include an internal voltage generating circuit. The internal voltage generating circuit generates the voltage (programming voltage Vpgm, passing voltage Vpass, reading voltage Vread, erasing voltage Vers (incl. erase pulse)) required for reading, programming and erasing the data.

The memory mats MAT-0, MAT-1 are memory arrays formed in a physically separated area. Preferably, the memory arrays MAT-0, MAT-1 are respectively formed in a separated P-well; here, the term "memory mat" is used for ease of description. However, the memory mat and memory plane or memory bank are the same in terms of definition.

The memory mat MAT-0 includes a plurality of blocks in one P-well. In the example, the memory mat MAT-0 consists of 1024 blocks. Also, the memory mat MAT-1 consists of 1024 blocks in one P-well similarly to the memory mat MAT-0.

The word line selection circuit 160 is disposed between the two memory mats MAT-0, MAT-1. The word line selection circuit 160 selects any one of the memory mats MAT-0 or MAT-1 according to the row address information Ax, and selects the block and page of the selected memory mat. Meanwhile, two page buffers/reading circuits 170-0, 170-1 and two column selection circuits 180-0, 180-1 are respectively prepared for the two memory mats MAT-0, MAT-1.

Figure 4:
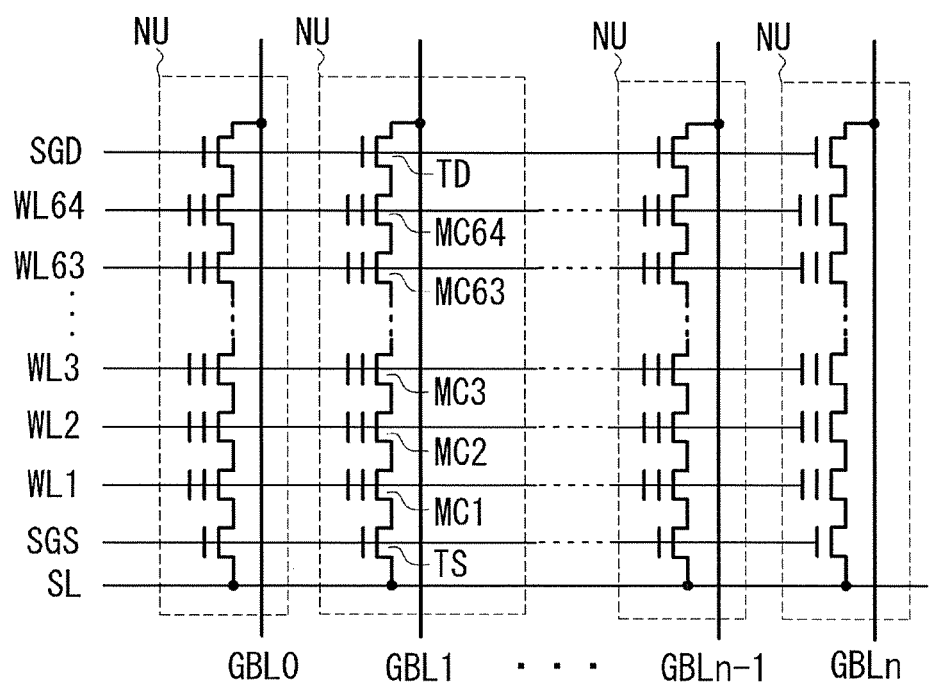
FIG. 4 illustrates a configuration of an NAND string.

In one block, as shown in FIG. 4, a plurality of NAND string unit NU that connect a plurality of memory cells in series are formed. In the drawing, in one block, there are n+1 NAND string units NU arranged along a row direction. The NAND string unit NU includes a plurality of memory cells MCi (i=1, 2, 3 . . . , 64) connected in series; a bit line side selection transistor TD connected to one of end portion, i.e., a drain side of a memory cell MC64; and a source line side selection transistor TS connected to a source side of the memory cell MC0. The drain of the bit line side selection transistor TD is connected to a corresponding bit line GBL among GBL0-GBLn. The source of the source line side selection transistor TS is connected to a common source line SL.

A following table 1 lists bias voltages applied in various operations of the flash memory. In a read operation, a certain positive voltage is applied to the bit line; a certain voltage (for example, 0V) is applied to the selected word line; the pass voltage Vpass (for example, 4.5V) is applied to the non-selected word lines; a positive voltage (for example, 4.5V) is applied to selection gate lines SGD and SGS to turn on a bit line side selection transistor TD and a source line side selection transistor TS; and 0V is applied to the common source line SL. In a programming (writing) operation, the programming voltage Vpgm with a high potential (15V-20V) is applied to the selected word line; a middle potential (for example, 10V) is applied to the non-selected word lines to turn on the bit line side selection transistor TD and turn off the source line side selection transistor TS; and a potential corresponding to the data "0" or "1" is provided to the bit line GBL. In the erasing operation, 0V is applied to the selected word line in the block, a high voltage (for example, 20V) is applied to the P-well to draw electrons of a floating gate to a substrate; in this way, data is erased in a unit of block.

TABLE 1

|  | Erase | Write | Read |
| --- | --- | --- | --- |
| Selection word line | 0 | 15~20 V | 0 |
| Non-Selection word line | F | 10 V | 4.5 |
| SGD | F | Vcc | 4.5 |
| SGS | F | 0 | 4.5 |
| SL | F | Vcc | 0 |
| P-well | 20 | 0 | 0 |

The ECC circuit 140 performs error checking and correction on the data to be programmed to the memory mat or the data read from the memory mat. The ECC operation is performed via, for example, conventional methods such as hamming code or Reed-Solomon by converting the k bit or k byte of input data Di into p=k+q. "q" is the error correction code or parity bit required for data error checking correction.

Figure 1:
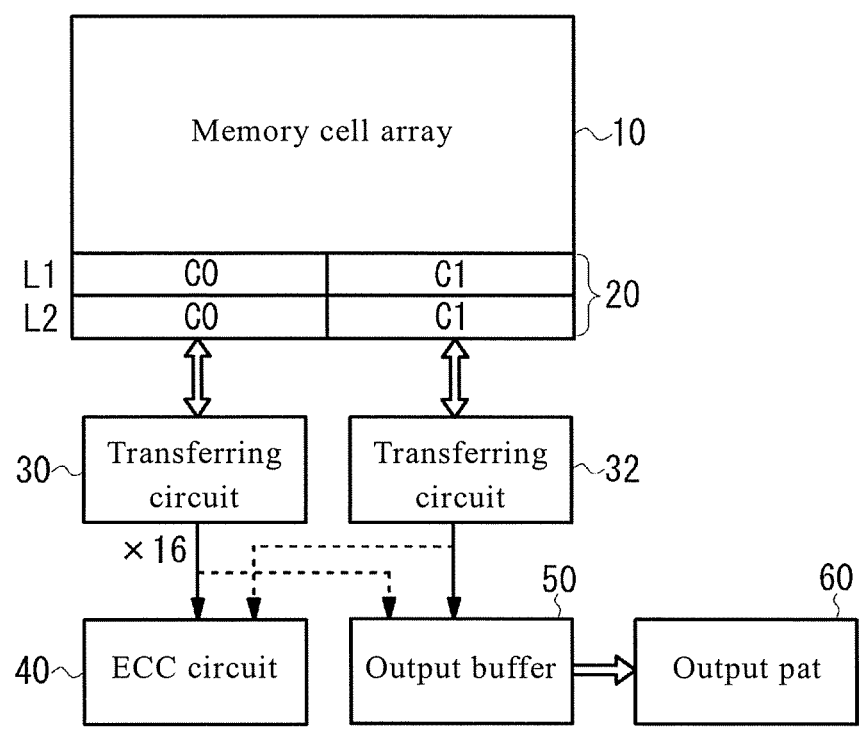
FIG. 1 illustrates a schematic configuration of a conventional NAND flash memory.
Figure 2:
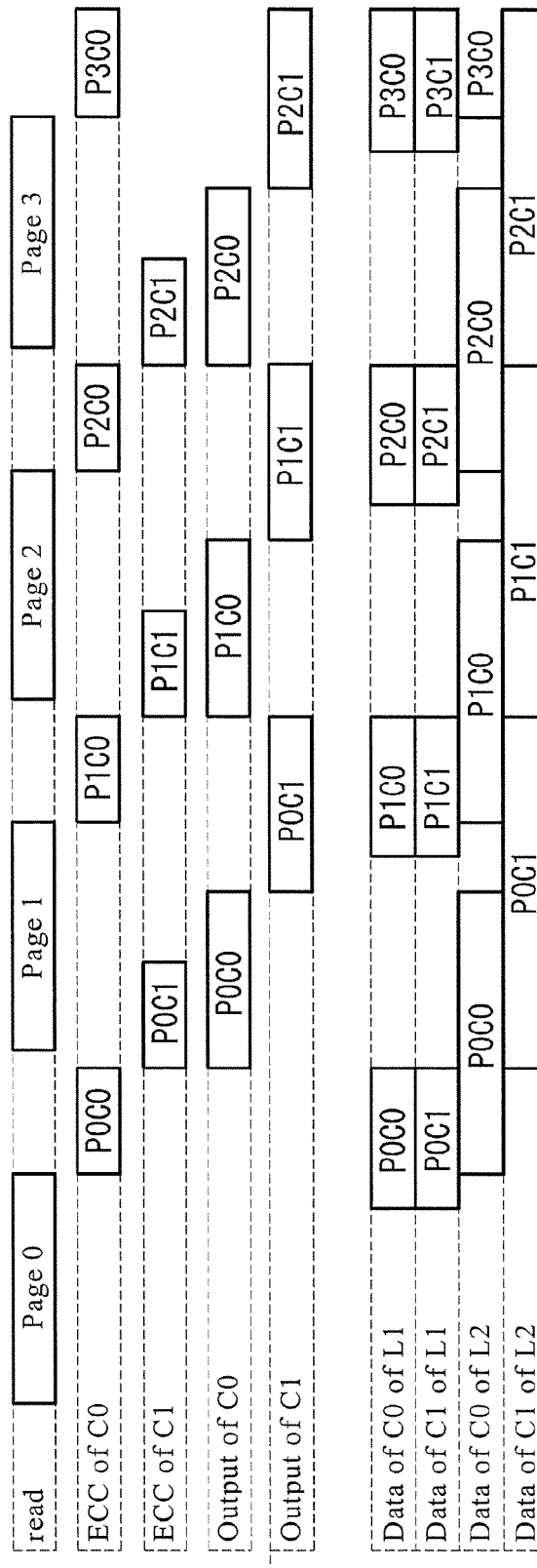
FIG. 2 is a timing chart illustrating performing continuous reading operation for pages on a conventional NAND flash memory.
Figure 5A:
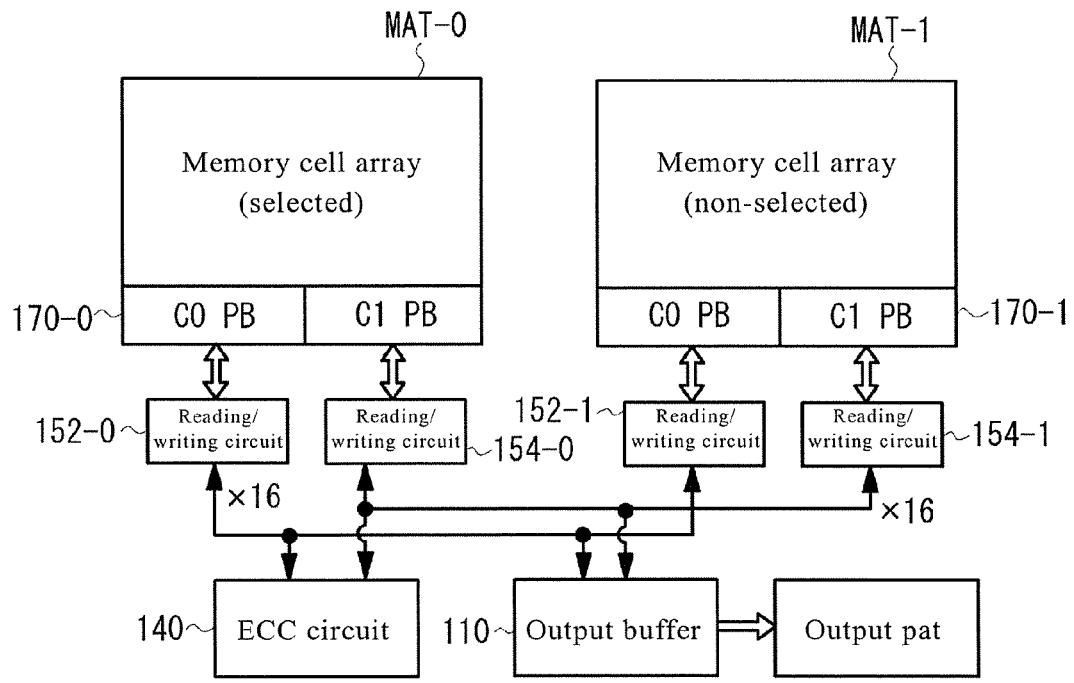
FIGS. 5(A) and 5(B) illustrate a schematic configuration of a page buffer and a transferring control element of an NAND flash memory according to an embodiment of the invention.

The transferring control portion 150 controls data transferring between page buffer/reading circuit 170-0, page buffer/reading circuit 170-1, ECC circuit 140, and input/output buffer 110. FIG. 5(A) illustrates detailed configuration of the page buffer/reading circuit (hereafter "page buffer") 170-0, 170-1 and transferring control portion 150. The page buffer 170-0 that holds the data read from the memory mat MAT-0 includes the first high speed buffer portion C0 and the second high speed buffer portion C1. For example, if the size of the page buffer 170-0 is 2 KB, then the first high speed buffer portion C0 and the second high speed buffer portion C1 are respectively 1 KB as well. Likewise, the page buffer 170-1 which holds the data read from the memory cell of the memory mat MAT-1 includes the first high speed buffer portion C0 and the second high speed buffer portion C1. The first high speed buffer portion C0 may transfer data independent of the second high speed buffer portion C1 via the transferring control portion 150. The second high speed buffer portion C1 may transfer data independent of the first high speed buffer portion C0 via the transferring control portion 150 as well. Here, it should be pointed out that the page buffers 170-0, 170-1 of the embodiment are a one-stage latch structure including the first high speed buffer portion C0 and the second high speed buffer portion C1 rather than the conventional NAND flash memory (see FIG. 1) which includes two-stage latches L1, L2.

The transferring control portion 150 includes reading/writing circuits 152-0, 152-1, 154-0, 154-1 capable of transferring data in dual directions between the page buffer 170-0, page buffer 170-1, ECC circuit 140 and output buffer 110. The reading/writing circuit 152-0 controls the reading/writing operations performed on the data in the first high speed buffer portion C0 of the page buffer 170-0. The reading/writing circuit 154-0 controls the reading/writing operations performed on the data in the second high speed buffer portion C1 of the page buffer 170-0. The reading/writing circuit 152-1 controls the reading/writing operations performed on the data in the second high speed buffer portion C1 of the page buffer 170-1. The reading/writing circuit 154-1 controls the reading/writing operations performed on the data in the second high speed buffer portion C1 of the page buffer 170-1. The four reading/writing circuits are controlled by the control portion 130.

For example, in the reading operation, the reading/writing circuit 152-0 transfers the read data held by the first high speed buffer portion C0 of the page buffer 170-0 to the ECC circuit 140. When the ECC circuit 140 detects an error, the reading/writing circuit 152-0 only reverses the erroneous data in the first high speed buffer portion C0. Meanwhile, the reading/writing circuit 152-0 is capable of transferring the data held by the first high speed buffer portion C0 to the output buffer 110. Furthermore, when the memory mat MAT-0 is selected, the reading/writing circuit 152-0 is capable of transferring the data to the first high speed buffer portion C0 of the non-used page buffer 170-1 of the non-selected memory mat MAT-1. The rest of reading/writing circuits 154-0, 152-1 and 154-1 can also perform the same operation.

The following paragraph describes performing a continuous reading operation for pages in the flash memory of the embodiment. Preferably, the continuous reading operation for pages is performed in a flash memory having a serial peripheral interface (SPI). The control portion 130 is capable of performing continuous reading operation for pages, for example, when receiving a read command for continuous pages from an external host device, or when the power of the flash memory is on. The leading page in the continuous reading operation may be a row address input from the external host device; or a leading row address may be acquired from a non-volatile configuration register accessed in a power-up sequence. In the continuous reading operation for pages, the acquired leading row address is set in the address counter. When the selected page in the selected block of the selected memory mat is read, the address counter is automatically incremented so as to select the next page in the memory mat. Also, the continuous reading operation for pages may be ended by a command from the external host device, or ended at a final row address held by the configuration register, or ended when the final page of the final block of the memory mat is reached.

Figure 5B:
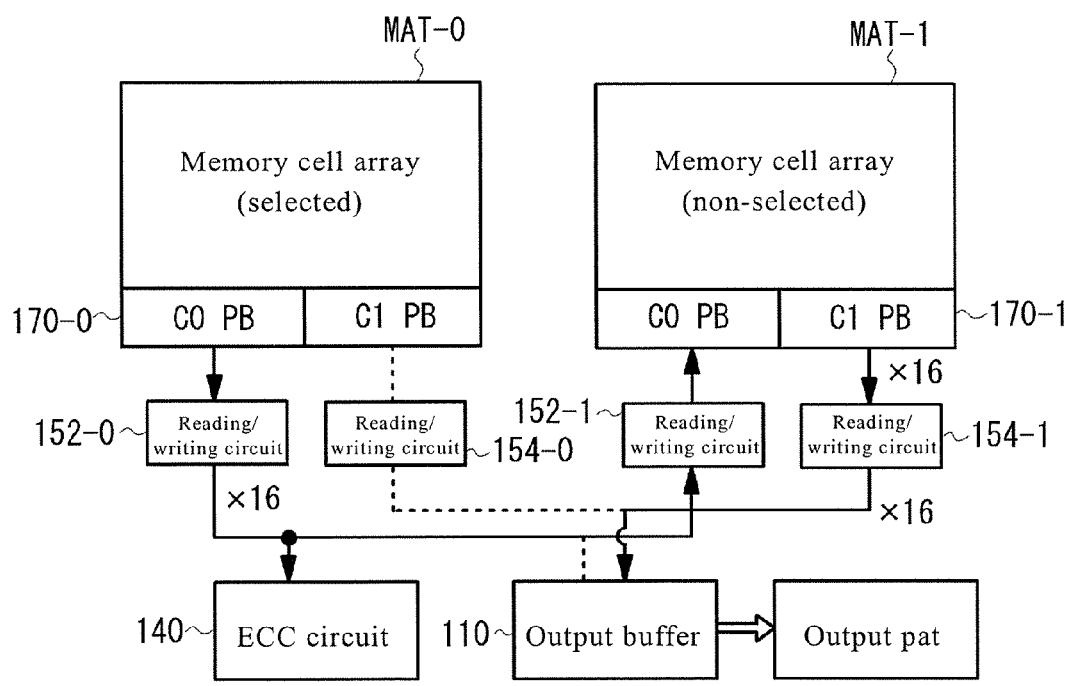
Figure 6:
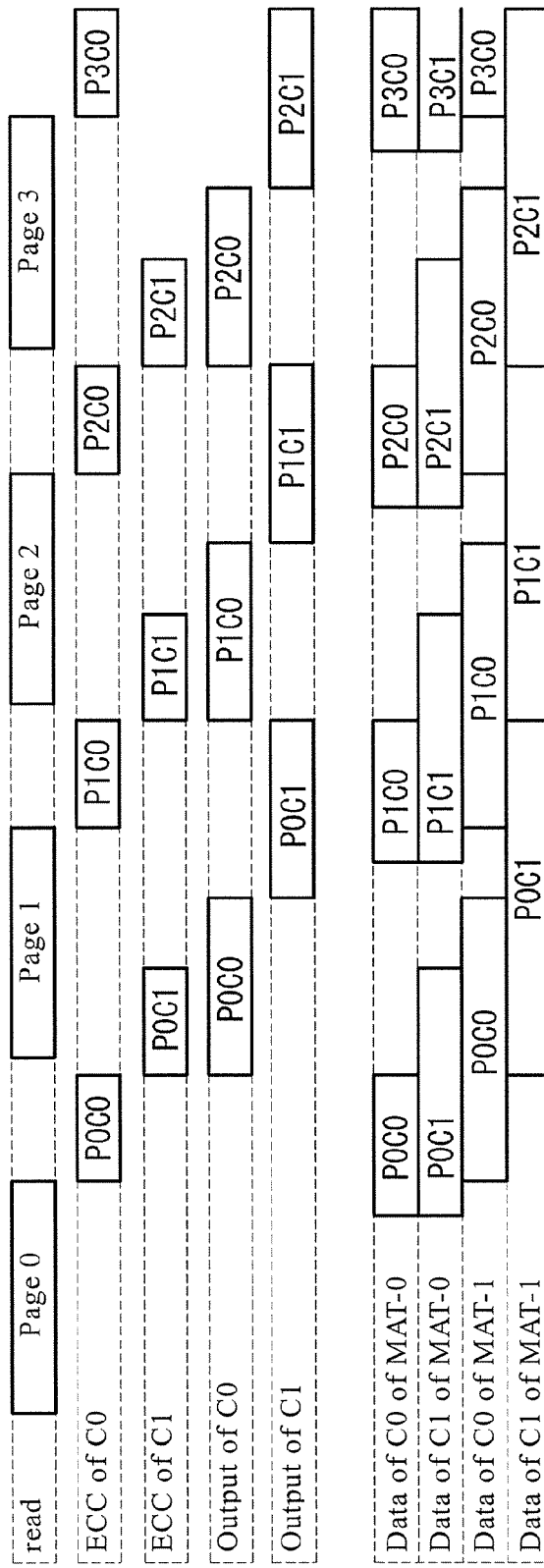
FIG. 6 illustrates a timing chart of continuous reading operation for pages according to an embodiment of the invention.

Here, in response to that the memory mat MAT-0 is selected, the continuous reading operation begins from a page 0 in a block 0 of the memory mat MAT-0. Embodiment is described with reference to FIG. 5(B) and timing chart in FIG. 6.

1. The initial page 0 of the selected memory mat MAT-0 begins to be read, and the read data is held in the first high speed buffer portion C0 and the second high speed buffer portion C1 (P0C0, P0C1) of the page buffer 170-0.

2. Next, the reading/writing circuit 152-0 transfers the data in the first high speed buffer portion C0 to the first high speed buffer portion C0 of the page buffer 170-1 of the non-selected memory mat MAT-1, and the data is transferred to the ECC circuit 140 in parallel. The error checking result of the ECC circuit 140 is performed directing at the first high speed buffer portion C0 of the page buffer 170-1 of the non-selected memory mat MAT-1. That is, when the ECC circuit 140 detects an error, the reading/writing circuit 152-1 reverses the erroneous bit that is detected in the first high speed buffer proton C0 of the page buffer 170-1. Meanwhile, for example, when the page buffer is divided into a plurality of sectors, the ECC operation is performed sector by sector; accordingly, the reading/writing circuit 152-0 transfers data in a unit of sector. When the data error checking and correcting operation in one sector (e.g., 256 byte or 512 byte and so on) is completed via the ECC circuit 140, the reading/writing circuit 152-0 reads the data in the next sector, and transfers the data to the ECC circuit 140 and the first high speed buffer portion C0 of the page buffer 170-1.

3. (a) When the ECC operation in the first high speed buffer portion C0 is completed, subsequently, the data undergoing ECC operation is outputted. Data output begins from the first high speed buffer portion C0 of the non-selected memory mat MAT-1. The reading/writing circuit 152-1 transfers the data undergoing the ECC operation and held by the first high speed buffer portion C0 to the output buffer 110. In this manner, the data held by the output buffer 110 is output from the output pat to the outside. The SPI interface is a simultaneous serial communication and supplies a serial clock SCK to the flash memory 100 from the outside. The data held by the output buffer 110 is outputted simultaneously with the serial clock SCK. The number of the output pat (output terminal) for performing serial output may be one or more.

(b) In parallel with said operation, the data in the second high speed buffer portion C1 of the page buffer 170-0 is transferred to the second high speed buffer portion C1 of the page buffer 170-1 of the non-selected memory mat MAT-1 via the reading/writing circuit 154-0, and transferred to the ECC circuit 140, thereby performing error checking and correcting operation on the read data in the second high speed buffer portion C1. The error checking and correction result of the ECC circuit 140 is performed with respect to the second high speed buffer portion C1 of the non-selected memory mat MAT-1 via the reading/writing circuit 154-1.

(c) In continuation and in parallel with said operation, a page 1 of the selected memory mat MAT-0 is read. When the reading operating on the page 1 is completed, the data of the page 1 is saved into the page buffer 170-0 (P1C0, P1C1). Thereafter, only the data in the first high speed buffer portion C0 is transferred to the first high speed buffer portion C0 of the non-selected memory mat MAT-1, and ECC operation is performed in parallel. The operations described in (a), (b) and (c) are performed in parallel.

4. When the outputting operation on the first high speed buffer portion C0 is completed, the outputting operation on the second high speed buffer portion C1 begins.

5. When the outputting operation on the second high speed buffer portion C1 is completed, a second page undergoes the operation as described in point 3.

In this manner, according to the embodiment, the page buffer of each of the memory mats is a one-stage latch structure. However, by using the page buffer of the selected memory mat and the page buffer of the non-selected memory mat, the reading operation performed by two-stage latches can be realized substantially. Accordingly, the structure of the page buffer can be simplified.

The following paragraph is dedicated to the second example of the invention. The continuous reading operation for pages may be performed across memory mats. For example, the leading page is memory mat MAT-0, and the ending page is memory mat MAT-1. At this point, if the data read from the last page of the selected memory mat MAT-0 is transferred to the non-selected memory mat MAT-1, when the initial page of the next non-selected memory mat is read, conflict will be generated between the data read from the page buffer 170-1 and the transferred data. In the following second example, when the continuous reading operation for pages is performed across memory mats, such conflict generated among the data in the page buffers is avoided.

Figure 7:
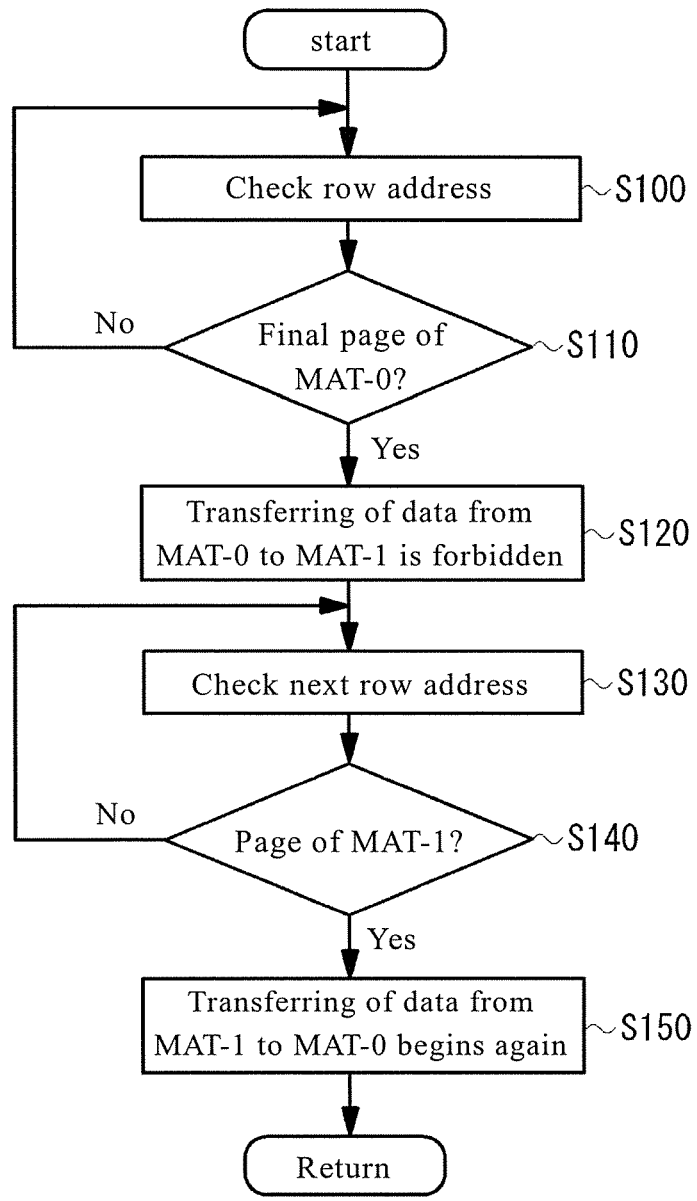
FIG. 7 is a flowchart illustrating performing continuous reading operation across memory mats according to an embodiment of the invention.

FIG. 7 is a flowchart describing continuous reading operation for pages in the second example. Here, it is set that the continuous reading operation for pages is switched from the memory mat MAT-0 to the memory mat MAT-1. When continuous reading operation for pages begins, the control portion 130 checks the row address of the page to be selected (S100). In the continuous reading operation for pages, the row address is generated by making the address counter increment automatically so that the control portion 130 can check the value of the address counter.

Figure 8:
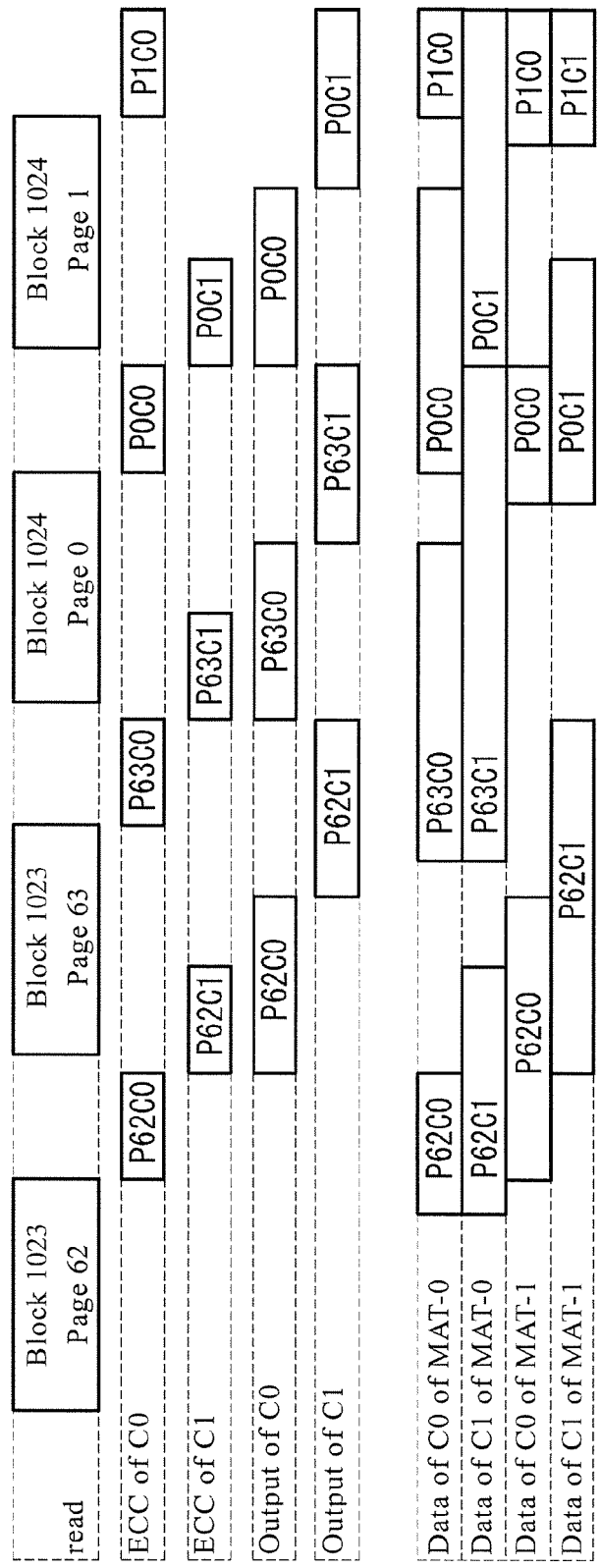
FIG. 8 is a timing chart illustrating performing continuous reading operation across memory mats according an embodiment of the invention.

Subsequently, the control portion 130 determines whether the row address is equivalent to the final page of the memory mat MAT-0 (S110). As shown in FIG. 3, the memory mat MAT-0 has a block 0 through a block 1023. One block contains page 0 through page 63 (see FIG. 4). Therefore, the control portion 130 determines whether the row address is equivalent to the page 63 of the block 1023. If the row address is equivalent to the final page, then the transferring control portion 150 forbids transferring the data of the page 63 held by the page buffer 170-0 of the memory mat MAT-0 to the page buffer 170-1 of the memory mat MAT-1 (S120). As shown in FIG. 8, when the array of the page 63 is read, the data of the page 63 is held in the first high speed buffer portion C0 and the second high speed buffer portion C1 of the page buffer 170-0 of the memory mat MAT-0. However, the data of the page 63 is not transferred to the page buffer 170-1 of the memory mat MAT-1. The data that is held by the first high speed buffer portion C0 of the page buffer 170-0 is transferred to the ECC circuit 140 via the reading/writing circuit 152-0, and the ECC operation is performed therein. Next, the data held by the second high speed buffer portion C1 is transferred to the ECC circuit 140 via the reading/writing circuit 154-0, and the ECC operation is performed therein. During the ECC operation is performed in the second high speed buffer portion C1, the data that undergoes the ECC operation and held by the first high speed buffer portion C0 is transferred to the output buffer 110 via the reading/writing circuit 152-0, and outputted to the outside in response to the serial clock SCK. During the ECC operation is performed in the first high speed buffer portion C0 and the second high speed buffer portion C1, the array of the page of the next memory mat MAT-1 is read.

Referring to FIG. 7 again, the control portion 130 checks the next row address (S130) and determines whether the next row address is equivalent to the page of the memory mat MAT-1 (S140). For example, based on the example of FIG. 3, it is determined whether the next row address is equivalent to the page 0 of the block 1024. If yes, the control portion 130 controls the transferring control portion 150 to begin transferring again from the memory mat MAT-1 to the memory mat MAT-0 (S150).

As shown in FIG. 8, when the array of the page 0 of the block 1024 is read, the data of the page 0 is held in the first high speed buffer portion C0 and the second high speed buffer portion C1 of the page buffer 170-1 of the memory mat MAT-1. Meanwhile, the data that is held by the first high speed buffer portion C0 is transferred to the first high speed buffer portion C0 of the memory mat MAT-0 via the reading/writing circuit 152-1, and transferred to the ECC circuit 140 for performing the ECC operation. Next, the data in the first high speed buffer portion C0, for which the ECC operation is completed and held by the page buffer 170-0 of the memory mat MAT-0, is transferred to the output buffer 110 via the reading/writing circuit 152-0, and outputted to the outside. In this time period, the data in the second high speed buffer portion C1 of the page buffer 170-1 of the memory mat MAT-1 is transferred to the second high speed buffer portion C1 of the page buffer 170-0 of the memory mat MAT-0 via the reading/writing circuit 154-1, and transferred to the ECC circuit 140 for performing the ECC operation.

In this manner, according to the second example, in the condition of performing continuous reading operation for pages across memory mats, it is forbidden that the read data of the final page of the selected memory mat is transferred to the non-selected memory mat. When the leading page of the selected memory mat is read in the subsequent process, the data read from the array begins to be transferred to the non-selected memory mat again. In this manner, the continuous reading operation for pages that avoids conflict from being generated among the data in page buffers can be performed.

The embodiment exemplifies that the memory cell array of the flash memory has two memory mats, but the memory cell array may include three memory mats or more. For example, when the memory cell array includes four memory mats, not only the page buffer of the non-selected memory part can be utilized between two of the selected memory mats among the four memory mats, but also the page buffer of the non-selected memory mats can be utilized between the four memory mats. Therefore, in the condition that three memory mats or more are included, when the continuous reading operation for pages is performed across memory mats, it may not be required to forbid transferring the data from the selected memory mat to the non-selected memory mat. When the reading operation is performed across memory mats, the page buffer of other memory mats, rather than the memory mat to be selected subsequently, may be utilized.

Furthermore, the invention is adapted to either one of the flash memory that stores binary data in the memory cell or the flash memory that stores multi-valued data in the memory cell. Furthermore, the invention is adapted to either one of the two dimensional flash memory formed on a substrate surface in the NAND string of memory array or a three-dimensional flash memory of a conductive layer (e.g., polysilicon layer) formed on the substrate surface of NAND string.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A non-volatile semiconductor memory device, comprising:
    a memory array, at least comprising a first memory plane and a second memory plane;
    a reading element, capable of reading data from the first memory plane or the second memory plane;
    a first data holding element, capable of holding data read from the first memory plane;
    a second data holding element, capable of holding data read from the second memory plane;
    an error checking correcting element, performing data error checking and correction;
    an outputting element, outputting data; and
    a transferring control element, controlling transferring of data between the first data holding element, the second data holding element, the error checking correcting element and the outputting element,
    wherein when the first memory plane is selected, the transferring control element transfers the data held by the first data holding element to the second data holding element of the non-selected second memory plane.

2. The non-volatile semiconductor memory device according to claim 1, wherein,
    when the second memory plane is selected, the transferring control element transfers the data held by the second data holding element to the first data holding element of the non-selected first memory plane.

3. The non-volatile semiconductor memory device according to claim 1, wherein,
    when the first memory plane is selected, the transferring control element transfers the data held by the first data holding element to the second data holding element and to the error checking correcting element.

4. The non-volatile semiconductor memory device according to claim 3, wherein,
    when the second memory plane is selected, the transferring control element transfers the data held by the second data holding element to the first data holding element and to the error checking correcting element.

5. The non-volatile semiconductor memory device according to claim 1, wherein,
    when the first memory plane is selected, the transferring control element transfers the data operated by the error checking correcting element and held by the second data holding element to the outputting element.

6. The non-volatile semiconductor memory device according to claim 1, wherein,
    when the second memory plane is selected, the transferring control element transfers the data operated by the error checking correcting element and held by the first data holding element to the outputting element.

7. The non-volatile semiconductor memory device according to claim 1, wherein,
    the first data holding element comprises a first holding area and a second holding area, the second data holding element comprises a third holding area and a fourth holding area,
    in a time period during which the transferring control element transfers the data in the third holding area of the second data holding element to the outputting element, the transferring control element transfers the data in the second holding area of the first data holding element to the fourth holding area of the second data holding element and the error checking correcting element.

8. The non-volatile semiconductor memory device according to claim 7, wherein,
    in a time period during which the transferring control element transfers the data in the fourth holding area of the second data holding element to the outputting element, the transferring control element transfers the data in the first holding area of the first data holding element to the third holding area of the second data holding element and the error checking correcting element.

9. The non-volatile semiconductor memory device according to claim 1, wherein,
    the reading element performs continuous reading operation for pages in the first memory plane or the second memory plane.

10. The non-volatile semiconductor memory device according to claim 1, wherein,
    when the reading element performs continuous reading operation for pages, the transferring control element determines whether a selected page is equivalent to a final page in a memory plane, if yes, the read data is forbidden from being transferred from a selected memory plane to a non-selected memory plane.

11. The non-volatile semiconductor memory device according to claim 10, wherein,
    the transferring control element further determines whether the selected page is equivalent to a leading page of a memory plane to be selected subsequently, if yes, then the read data begins to be transferred again from a selected memory plane to a non-selected memory plane.

12. The non-volatile semiconductor memory device according to claim 1, wherein,
    the outputting element outputs data in response to an external serial clock signal.

* * * * *